United States Patent [19]

Flagello et al.

[11] Patent Number: 4,770,947
[45] Date of Patent: Sep. 13, 1988

[54] MULTIPLE DENSITY MASK AND FABRICATION THEREOF

[75] Inventors: Donis G. Flagello; Jane M. Shaw, both of Ridgefield, Conn.; David F. Witman, Pleasantville, N.Y.

[73] Assignee: International Business Machines Corporation, Armonk, N.Y.

[21] Appl. No.: 212

[22] Filed: Jan. 2, 1987

[51] Int. Cl.⁴ .............................................. B32B 15/00
[52] U.S. Cl. ................................... 428/630; 428/667; 428/674; 428/675; 428/677; 428/680
[58] Field of Search ............... 428/620, 630, 666, 667, 428/674, 675, 676, 677, 680, 681, 685

[56] References Cited

U.S. PATENT DOCUMENTS

| | | | |
|---|---|---|---|
| 4,201,800 | 5/1980 | Alcorn et al. | 430/5 |
| 4,411,972 | 10/1983 | Narken et al. | 430/5 |
| 4,512,863 | 4/1985 | Criss et al. | 428/630 |
| 4,563,400 | 1/1986 | Criss et al. | 428/630 |

FOREIGN PATENT DOCUMENTS 2090016  6/1982  United Kingdom.

OTHER PUBLICATIONS

Cook, et al., "Multilayer Semitransparent Photomask", IBM Technical Disclosure Bulletin, vol. 15, No. 5, Oct. 1972, pp. 1465–1466.

Abolafia, et al., "Dual-Density Mask for Photoresist", IBM Technical Disclosure Bulletin, vol. 19, No. 12, May 1977, p. 4539.

*Primary Examiner*—L. Dewayne Rutledge
*Assistant Examiner*—George Wyszomierski
*Attorney, Agent, or Firm*—Pollock, Vande Sande & Priddy

[57] ABSTRACT

A multi-layer structure that includes a transparent dielectric substrate, a layer of a nickel-containing steel alloy, and a layer of copper and/or chrome.

9 Claims, 2 Drawing Sheets

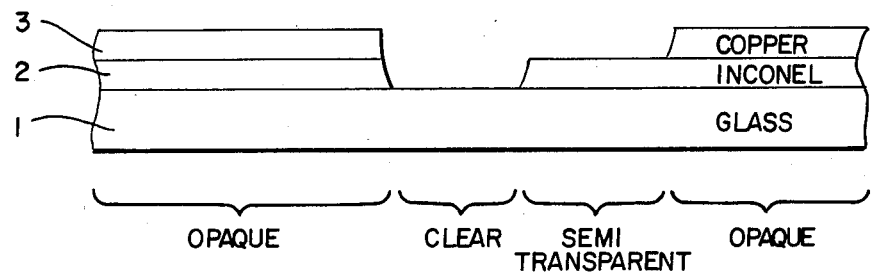
FIG 5
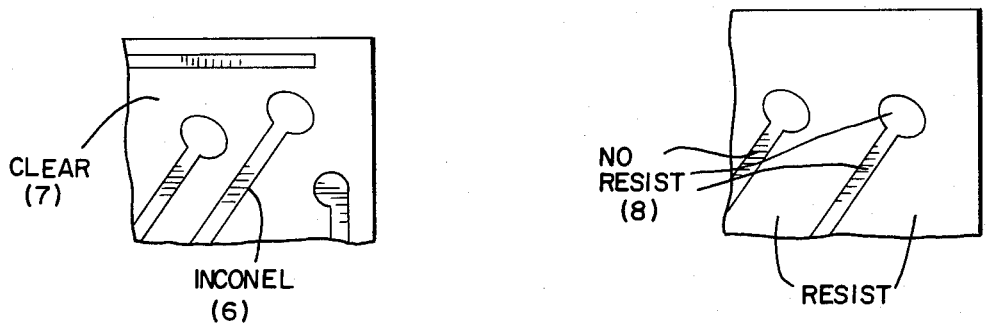
FIG 6
FIG 7
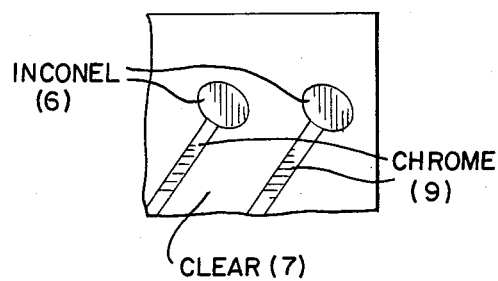
FIG 8

MULTIPLE DENSITY MASK AND FABRICATION THEREOF

DESCRIPTION

TECHNICAL FIELD

The present invention is concerned with providing multi-layer structures and especially concerned with providing a multi-layer photomask structure. In particular, the present invention is especially directed to multi-density photomasks. In addition, the present invention is concerned with the fabrication of the structures of the present invention.

BACKGROUND ART

In the fabrication of integrated circuits, one of the more critical procedures is the photolithographic processing. For instance, photolithographic processes in microelectronic devices require precision and reliability in the alignment of the photomasks employed. Accordingly, much work has been done over the years to minimize, as much as possible, the number of alignment steps required.

One technique that has been suggested for reducing photomasking processing time is to provide a multi-layer, multi-density photoresist mask. Such a mask includes a substrate of a transparent material coated in preselected locations with a layer of a semitransparent material and a layer of another material that is opaque. The purpose of such masks of the partially transparent areas is to partially expose a portion of photoresist lying beneath the mask that is being developed. The use of multi-density photoresist masks involves removing the photoresist that is being developed in two or more stages. In particular, the fully exposed photoresist is initially removed and the areas that are exposed in the device being fabricated are then etched. Next, the partially exposed photoresist is removed and different areas are then exposed and can be etched in the fabrication of the desired device.

Examples of suggestions of multi-density photomasks can be found in Cook, et al., "Multi-layer Semitransparent Photomask", IBM Technical Disclosure Bulletin, Volume 15, No. 5, October 1972, pages 1465–1466 and Abolafia, et al., "Dual-Density Mask for Photoresist", IBM Technical Disclosure Bulletin, Volume 19, No. 12, May 1977, page 4539.

The present technology with respect to multi-density photomasks could stand improvement, especially with respect to being able to provide high selectivity to uniformly and reproducibly provide the desired patterns in the different layers without the necessity of resorting to complex and time consuming processing techniques. For instance, the present mask manufacturing methods employ either a subtractive etch process to remove unwanted metal or a lift-off process evaporated through the stencil, and the stencil removed. The problems with these methods for multi-density masks are that the present subtractive process is not selective enough to avoid etching both materials used. On the other hand, the lift-off process requires increased complexity and more process steps and is, thus, relatively expensive.

SUMMARY OF INVENTION

The present invention is concerned with a multi-layer structure that comprises a transparent dielectric substrate having a minimum transmittance of about 90% having a layer of a nickel-containing steel alloy and a layer of a metal thereon. The metal can be copper and/or chromium. The copper and/or chrome can be provided on top of the steel layer or vice versa.

In addition, the present invention is concerned with a multi-density photomask wherein the layer of nickel-containing steel alloy and layer of copper and/or chromium are provided in a predetermined pattern less than the entire area of the substrate.

In addition, the present invention is concerned with a process for fabricating a multi-density photomask that contains as the opaque portion, copper. In particular, the process includes providing a layer of a nickel-containing steel alloy and a layer of copper on a transparent dielectric substrate. The dielectric substrate employed has a minimum transmittance of about 90%. The layer of copper can be provided on top of the layer of nickel-containing steel alloy or vice versa. A layer of photoresist material is provided on the top metal layer (steel or copper), and the photoresist is exposed and developed. The copper and the nickel-containing steel alloy are selectively etched to remove the exposed portions thereof. A photoresist layer on the top metal layer is exposed and developed and the exposed portion of the metal layer beneath the photoresist layer is selectively etched. The photoresist is removed, thereby providing the multi-density photomask.

The present invention is also concerned with another process that is applicable for fabricating a multi-density photoresist mask that includes copper and/or chromium to provide the opaque portions of the mask. This process includes providing a first metallic layer of a nickel-containing steel alloy or a metallic layer of copper and/or chrome on a transparent dielectric substrate. The dielectric substrate has a minimum transmittance of about 90%. A first layer of photoresist material is provided on the metallic layer. The first layer of photoresist materials is exposed and developed, and the exposed portions of the metallic layer are etched. A second layer of photoresist material is provided over the substrate and over the remaining portion of the metallic layer. The second layer of photoresist material is exposed and developed; thereby removing photoresist material from predetermined areas where a pattern of a second metallic layer is to be subsequently provided. A second metallic layer opposite from the first metallic layer and being a nickel-containing steel alloy or the copper and/or chromium layer is provided over the substrate, over the remaining portions of the first metallic layer, and over the remaining portions of the second layer of photoresist. The second layer of photoresist is stripped, thereby removing with it the portion of the second metallic layer that was located above the second layer of photoresist material. The second metallic material in the predetermined areas is left remaining.

SUMMARY OF DRAWINGS

FIGS. 1–5 illustrate the preferred process of the present invention of providing the preferred photoresist mask that contains copper as the opaque portion.

FIGS. 6–8 are schematic diagrams illustrating the fabrication of multi-density photomasks of the present invention.

BEST AND VARIOUS MODES FOR CARRYING OUT THE INVENTION

Figure 1:
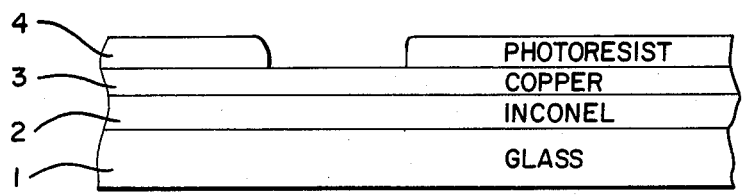

The transparent dielectric substrates employed in accordance with the present invention haVe a minimum transmittance of about 90% and preferably a minimum transmittance of about 95%. Examples of suitable dielectric substrates are quartz and glass such as borosilicate glass.

The layer, in accordance with the present invention, that provides for the semitransparent portions of the mask must be a nickel-containing steel alloy and preferably a nickel-containing steel alloy that contains at least about 45% by weight of nickel, such as the various Inconel alloys. Such alloys also preferably contain at least about 10% by weight of chromium. Examples of some specific nickel-containing steel alloys include Inconel that contains about 78% nickel and about 15% chromium, Inconel X that contains about 73% nickel and about 15% chromium, Inconel X550 that contains about 73% nickel and about 15% chromium, Inconel 700 that contains about 45% nickel and about 15% chromium and Inconel A that contains about 75–78% Ni and about 10% Cr. It is essential that the semitransparent layer be a nickel-containing steel alloy since such provides a flat or uniform response over the entire UV range for uniformity in use as a photomask; whereas, other steel alloys do not provide such a uniform response.

The nickel-containing steel alloy can be provided on top of the dielectric substrate with the layer of chromium and/or copper above the nickel-containing steel alloy or vice versa.

The nickel-containing steel alloy is generally employed in thicknesses of about 100Å to about 2000Å and preferably about 400Å to about 1200Å. The nickel-containing steel alloy layer can be provided on the glass by well-known metal sputtering techniques and need not be discussed herein in any great detail. In addition, products of the nickel-containing steel alloy coated onto glass substrates are commercially available such as from Ditric Optics under the trade designation Inconel Filters.

The metal portion to provide the opaque portion of the mask is chromium and/or copper and is preferably copper. It has been found, in accordance with the present invention, that when the copper is employed, the copper and the nickel-containing alloy are differentially etched by different solutions, thereby producing a high etch rate ratio between the two. This assures for uniformity and reproducibility in providing the desired photomask. In particular, there is high selectivity in etching between the copper and the nickel-containing steel alloy. Accordingly, when copper is employed to provide the opaque portions, the photomask can be fabricated by employing the relatively simple subtractive etch techniques. Copper can be etched with ferric chloride such as an aqueous solution of 1–5% by volume of the ferric chloride or copper sulfate etchant, which do not disturb or etch the underlying nickel-containing steel alloy. In addition, the nickel-containing steel alloy can be etched, for example, with a HCl/NaCl aqueous solution, such as one containing about 1N HCl and about 5N NaCl, that does not etch the overlying copper layer. Usually elevated temperatures such as about 40° C. are employed in etching the steel. Accordingly, use of the copper as the opaque portion is preferred in accordance with the present invention and provides for high selectivity that is not achievable with prior art suggested materials for multi-density photomasks, nor achievable employing the chrome or mixtures of chrome and copper in accordance with the other aspect of the present invention.

Nevertheless, that aspect of the present invention that employs chromium and/or mixtures of chrome with copper is advantageous since, for instance, the presence of the nickel-containing steel alloy acts to minimize any defects in the chromium-containing layer since less light will be able to penetrate through the defect. Accordingly, the final process yield is increased. In addition, the chrome-containing multi-density photomask, in accordance with the present invention, can be fabricated without requiring the relatively complex and expensive lift-off techniques previously employed that required creating the overhanging stencil, as well as the specific methods needed for removing the stencil, such as reactive ion etching apparatus.

The copper and/or chrome layers are usually provided in thicknesses of about 1000Å to about 5000Å, and preferably about 2000Å to about 4000Å.

The photoresists employed in the processing of the structures of the present invention can be positive or negative photoresists.

Examples of some negative or photohardenable photoresists are disclosed in U.S. Pat. Nos. 3,469,982; 3,526,504; 3,867,153; and 3,448,098; and published European patent application No. 0049504, disclosures of which are incorporated herein by reference. Polymers from methylmethacrylate and from glycidyl acrylate and/or from a polyacrylate such as trimethylol propane triacrylate and pentaerythritol triacrylate are commercially available from E.I. Du Pont de Nemours and Company under the trade designation "Riston".

Examples of positive photoresists are those based on phenol formaldehyde novolak polymers. Particular examples of such are the Shipley AZ type which are m-cresol formaldehyde novolak polymer compositions. Such include therein a diazo ketone such as 2-diazo-1-naphthol5-sulphonic acid ester.

For convenience in disclosing the process aspects of the present invention, the following discussions are directed to the preferred aspects of the present invention whereby the steel layer is on top of the transparent substrate intermediate between the transparent substrate and the copper and/or chrome.

However, it is understood that the copper and/or chromium layer can be present intermediate the transparent substrate and nickel-containing steel alloy, if desired. In such case, the sequence of providing the copper and/or chromium and the steel alloy will be reversed.

Reference to FIGS. 1 to 5 are schematic diagrams of fabricating structures of the present invention whereby copper is employed. In particular, a nickel-containing steel alloy (2) such as Inconel A of about 800Å thick is provided onto a glass transparent substrate (1) having a thickness of about 90 mils, by sputtering. Next, copper (3) is sputtered onto the Inconel (2) to about 0.15 to about 0.25 microns thick, typical of which is about 0.2 microns. A photoresist layer (4) such as positive photoresist AZ-4110, from Shipley, is provided on the copper (3), such as by spinning, to provide a thickness of about 1 to about 1.5 microns. The photoresist (4) is then baked at a temperature of about 80° C. to about 100° C., and preferably 80° C. to about 90° C. for about 20 to 30 minutes. The photoresist layer (4) is exposed to actinic radiation and developed such as with a potassium hydroxide 0.2 N solution.

Figure 2:
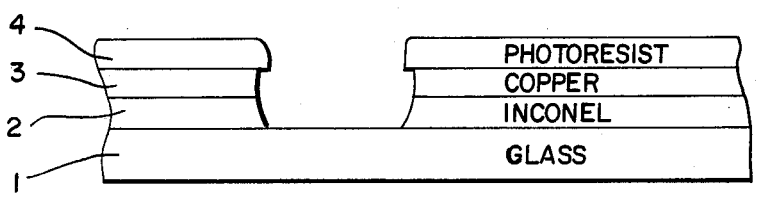

Next, as illustrated in FIG. 2, the copper layer is etched employing a ferric chloride aqueous solution about 1–5% by volume of ferric chloride at about room temperature. These solutions etch the copper (3) without effecting the underlying Inconel layer (2).

Next, as illustrated in FIG. 2, the Inconel layer (2) is etched using a HCl/NaCl aqueous solution containing about 1N HCl and about 5N NaCl at about 40° C. This solution etches the Inconel without effecting the copper present.

In the preferred aspects of the present invention, the photoresist (4) is stripped and the substrate is then coated with a second photoresist (5) and then the photoresist is baked at a temperature of about 80° C. to about 100° C., and preferably about 80° C. to about 90° C. for about 20 to about 30 minutes. The resist is provided to a thickness of about 1 micron.

Figure 3:
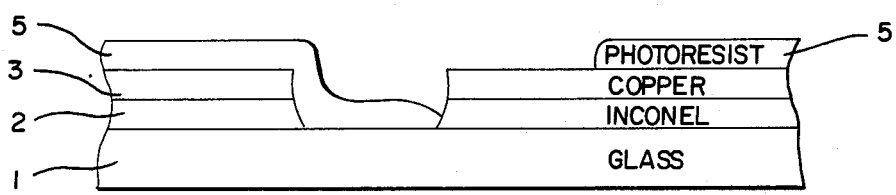
Figure 4:
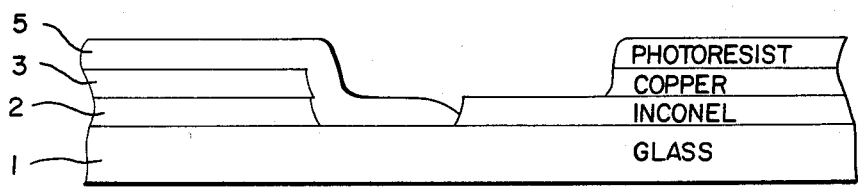

The photoresist layer (5), as illustrated in FIG. 3, is then exposed and developed so as to expose copper (3) in those areas where partial transmittance is desired to be subsequently provided.

The copper (3) that is exposed is then etched using a ferric chloride aqueous solution containing about 1–5% by volume of ferric chloride at about room temperature. The rate of etching is about 8000 angstroms per minute. See FIG. 4. The Inconel (2) is left in tact by the ferric chloride solution. The photoresist (5) is then stripped by, for instance, employing potassium hydroxide 0.2 N solution, leaving the structure illustrated in FIG. 5.

FIGS. 6–8 are schematic diagrams illustrating the fabrication of multi-density photomasks, in accordance with the present invention, that employ copper and/or chrome as the opaque portions. A nickel-containing steel alloy (6), such as Inconel A, is coated onto a transparent dielectric substrate (7), such as quartz or glass, by a well-known technique such as sputtering to a thickness of about 800 angstroms. In addition, the Inconel coated substrate can be commercially obtained, such as from Ditric Optics under the trade designation Inconel Filters.

A photoresist (not shown) is coated over the Inconel (7) and is then exposed and developed to provide the circuit pattern of Inconel (6), illustrated in FIG. 6. Wen the Inconel is etched and the photoresist is removed.

Next, a relatively thick resist coating (8) of approximately 3 microns is coated and soft-baked at a temperature of about 80° C. to about 100° C., and preferably about 80° C. to about 90° C. for about 20–30 minutes over the entire substrate and Inconel (6) pattern.

Next, the photoresist (8) is exposed and developed such that areas where the opaque portions are desired are removed as illustrated in FIG. 7. Chromium and/or copper (9) is then provided over the substrate (7), remaining Inconel (6), and remaining photoresist (8) to a thickness of about 800 to about 4000 angstroms, and preferably about 800 to about 2000 angstroms. The copper and/or chromium can be provided by sputtering and/or evaporation techniques.

Next, the structure is immersed in a solution that will strip the remaining photoresist, thereby removing copper and/or chrome that remained over the photoresist while leaving the copper and/or chromium in those areas where photoresist is not present. Some commercially available solutions for stripping the photoresist include J100 and R10 when employing a positive photoresist and R10 when employing a negative photoresist such as KTFR-polyisoprene.

Having thus described my invention, what I claim as new and desire to secure by Letters Patent is:

1. A multi-layer structure comprising a transparent dielectric substrate having a minimum transmittance of about 90%;
   a layer of a nickel-containing steel alloy; and
   a layer of a metal selected from the group consisting of Cu, chromium, and mixtures thereof and wherein each layer of nickel-containing steel alloy and layer of copper and/or chromium is provided on said substrate in a pattern less than the entire area of the substrate to provide a multi-density photomask.

2. The structure of claim 1 wherein said layer of a nickel-containing steel alloy is located on top of said dielectric substrate intermediate the dielectric substrate and said layer of a metal selected from the group consisting of Cu, chromium, and mixtures thereof.

3. The structure of claim 1 wherein said substrate is glass or quartz.

4. The structure of claim 1 wherein said steel alloy contains at least about 45% of Ni.

5. The structure of claim 4 wherein said steel further contains at least about 10% chromium.

6. The structure of claim 1 wherein said steel contains about 78% nickel and about 15% chromium.

7. The structure of claim 1 wherein said metal is copper.

8. The structure of claim 1 wherein said metal is chromium.

9. The multi-layer structure of claim 1 wherein the pattern of the layer of nickel-containing steel alloy differs from the pattern of the layer of copper and/or chromium.

* * * * *